US012292164B2

(12) United States Patent
Malinskiy et al.

(10) Patent No.: US 12,292,164 B2
(45) Date of Patent: May 6, 2025

(54) LIGHT SOURCE

(71) Applicant: Lazurite Holdings LLC, Cleveland, OH (US)

(72) Inventors: Eugene Malinskiy, Mayfield Village, OH (US); Ilya Malinskiy, Cleveland Heights, OH (US); Daniel Dudley, Cleveland, OH (US); Howard Fein, Richmond Heights, OH (US)

(73) Assignee: Lazurite Holdings LLC, Cleveland Heights, OH (US)

( * ) Notice: Subject to any disclaimer, the term of this patent is extended or adjusted under 35 U.S.C. 154(b) by 0 days.

(21) Appl. No.: 17/461,125

(22) Filed: Aug. 30, 2021

(65) Prior Publication Data

US 2021/0388951 A1   Dec. 16, 2021

Related U.S. Application Data

(63) Continuation of application No. 16/672,001, filed on Nov. 1, 2019, now Pat. No. 11,137,117, which is a
(Continued)

(51) Int. Cl.
*F21K 9/00* (2016.01)
*F21K 9/64* (2016.01)
(Continued)

(52) U.S. Cl.
CPC ............... *F21K 9/00* (2013.01); *F21K 9/64* (2016.08); *F21V 7/0066* (2013.01); *F21V 9/38* (2018.02);
(Continued)

(58) Field of Classification Search
CPC . F21K 9/64; F21K 9/00; F21V 7/0066; F21V 13/14; F21Y 2115/30
See application file for complete search history.

(56) References Cited

U.S. PATENT DOCUMENTS

| 5,178,616 A | 1/1993 | Uemiya et al. |
| 5,311,859 A | 5/1994 | Monroe et al. |

(Continued)

FOREIGN PATENT DOCUMENTS

| CN | 101821866 A | 9/2010 |
| CN | 104603530 A | 6/2015 |

(Continued)

OTHER PUBLICATIONS

Japanese Office Action dated Jun. 18, 2019 for Japanese Application No. 2018509824, 12 pages.
(Continued)

*Primary Examiner* — Thomas M Sember
(74) *Attorney, Agent, or Firm* — Morgan, Lewis & Bockius LLP

(57) ABSTRACT

An integrated light source includes: an emissive radiation source having a first spectrum; an optical element located to direct emissions from the emissive radiation source; a volumetric spectrum converter located to convert emissions directed from the emissive radiation source to emissions having a second spectrum different from the first spectrum; an optical reflector located about the converter; an output filter, the reflector being located to reflect the converter emissions towards the output filter; and a package body having an internal cavity containing the emissive radiation source, optical element, converter, reflector, and filter, wherein desired light radiates from the cavity through the filter.

23 Claims, 3 Drawing Sheets

Related U.S. Application Data continuation of application No. 15/753,369, filed as application No. PCT/US2016/047235 on Aug. 17, 2016, now Pat. No. 10,488,018.

(60) Provisional application No. 62/255,825, filed on Nov. 16, 2015, provisional application No. 62/205,978, filed on Aug. 17, 2015.

(51) Int. Cl.

| | | |
|---|---|---|
| *F21V 7/00* | (2006.01) | |
| *F21V 9/06* | (2018.01) | |
| *F21V 9/38* | (2018.01) | |
| *F21V 13/14* | (2006.01) | |
| *F21Y 115/30* | (2016.01) | |
| *H01S 5/00* | (2006.01) | |
| *H01S 5/02212* | (2021.01) | |
| *H01S 5/02253* | (2021.01) | |

(52) U.S. Cl.
CPC ............... *F21V 13/14* (2013.01); *F21V 9/06* (2013.01); *F21Y 2115/30* (2016.08); *H01S 5/0087* (2021.01); *H01S 5/02212* (2013.01); *H01S 5/02253* (2021.01)

(56) References Cited

U.S. PATENT DOCUMENTS

| | | |
|---|---|---|
| 5,879,289 A | 3/1999 | Yarush et al. |
| 6,007,255 A | 12/1999 | Krauter |
| 6,449,006 B1 | 9/2002 | Shipp |
| 6,806,681 B1 | 10/2004 | Cheiky |
| 7,091,653 B2 | 8/2006 | Ouderkirk et al. |
| 7,091,661 B2 * | 8/2006 | Ouderkirk ............ H01L 33/505 313/112 |
| 7,193,248 B2 | 3/2007 | Weindorf et al. |
| 7,394,188 B2 | 7/2008 | Ouderkirk et al. |
| 7,442,167 B2 | 10/2008 | Dunki-Jacobs et al. |
| 7,513,669 B2 | 4/2009 | Chua et al. |
| 7,553,683 B2 | 6/2009 | Martin et al. |
| 7,668,450 B2 | 2/2010 | Todd |
| 7,724,412 B2 | 5/2010 | Powell |
| 7,777,243 B2 | 8/2010 | Lin et al. |
| 7,786,879 B2 | 8/2010 | Lax |
| 7,798,692 B2 | 9/2010 | Krupa |
| 7,837,348 B2 | 11/2010 | Narendran et al. |
| 7,839,072 B2 | 11/2010 | Horiuchi et al. |
| 8,029,439 B2 | 10/2011 | Todd |
| 8,083,364 B2 | 12/2011 | Allen |
| 8,088,304 B2 | 1/2012 | Winkler et al. |
| 8,142,051 B2 | 3/2012 | Ducharme |
| 8,395,312 B2 | 3/2013 | Hum |
| 8,436,388 B2 | 5/2013 | Lim et al. |
| 8,519,609 B2 | 8/2013 | Winkler et al. |
| 8,545,396 B2 | 10/2013 | Cover et al. |
| 8,558,880 B2 | 10/2013 | Nambakam et al. |
| 8,562,161 B2 | 10/2013 | Tong et al. |
| 8,585,273 B2 | 11/2013 | Pokrovskiy et al. |
| 8,625,097 B2 | 1/2014 | Brukilacchio |
| 8,632,196 B2 | 1/2014 | Tong et al. |
| 8,748,921 B2 | 6/2014 | Martin et al. |
| 8,810,126 B2 | 8/2014 | Ito |
| 8,827,888 B2 | 9/2014 | Bolyard |
| 8,841,146 B2 | 9/2014 | Yen et al. |
| 8,882,284 B2 | 11/2014 | Tong et al. |
| 8,928,219 B2 | 1/2015 | Chan et al. |
| 8,946,982 B2 | 2/2015 | Winkler et al. |
| 9,147,814 B2 | 9/2015 | Waragaya |
| 9,217,544 B2 | 12/2015 | Tong et al. |
| 9,217,545 B2 | 12/2015 | Ito |
| 9,287,469 B2 | 3/2016 | Chakraborty |
| 9,303,830 B2 | 4/2016 | Ito |
| 9,316,361 B2 | 4/2016 | Tong et al. |
| 9,382,472 B2 | 7/2016 | Hefner, Jr. et al. |
| 9,383,496 B2 | 7/2016 | Parker et al. |
| 9,404,637 B2 | 8/2016 | Aeling et al. |
| 9,464,224 B2 | 10/2016 | Deshpande et al. |
| 9,500,325 B2 | 11/2016 | Tong et al. |
| 9,551,468 B2 | 1/2017 | Jones |
| 9,553,230 B2 | 1/2017 | Yoshida et al. |
| 9,587,791 B2 | 3/2017 | Ito |
| 9,611,987 B2 | 4/2017 | Kelchner et al. |
| 9,677,719 B2 | 6/2017 | He et al. |
| 2003/0156430 A1 | 8/2003 | Ota |
| 2005/0006659 A1 | 1/2005 | Ng et al. |
| 2005/0093430 A1 | 5/2005 | Ibbetson et al. |
| 2005/0116635 A1 | 6/2005 | Ito |
| 2006/0145599 A1 | 7/2006 | Reza et al. |
| 2006/0171693 A1 | 8/2006 | Todd et al. |
| 2006/0226759 A1 | 10/2006 | Masuda et al. |
| 2007/0086205 A1 | 4/2007 | Krupa |
| 2007/0267967 A1 | 11/2007 | Soshchin |
| 2008/0048200 A1 | 2/2008 | Mueller et al. |
| 2008/0116473 A1 * | 5/2008 | Sugiyama ............ H01L 33/483 257/E33.07 |
| 2008/0183028 A1 | 7/2008 | Garcia et al. |
| 2009/0034230 A1 | 2/2009 | Lim et al. |
| 2009/0040523 A1 | 2/2009 | Brukilacchio |
| 2009/0076328 A1 | 3/2009 | Root et al. |
| 2009/0151785 A1 | 6/2009 | Soshchin et al. |
| 2010/0033075 A1 | 2/2010 | Soshchin et al. |
| 2010/0061077 A1 | 3/2010 | Winkler et al. |
| 2010/0172148 A1 | 7/2010 | Komazaki et al. |
| 2010/0029871 A1 | 11/2010 | Pedersen |
| 2011/0069490 A1 | 3/2011 | Liu |
| 2011/0157865 A1 | 6/2011 | Takahashi |
| 2011/0172492 A1 | 7/2011 | Erikawa |
| 2011/0208004 A1 | 8/2011 | Feingold |
| 2011/0227102 A1 | 9/2011 | Hussel et al. |
| 2011/0261183 A1 | 10/2011 | Ma et al. |
| 2012/0029289 A1 | 2/2012 | Kucklick |
| 2012/0051075 A1 | 3/2012 | Harada et al. |
| 2012/0116369 A1 | 5/2012 | Viola |
| 2013/0004147 A1 | 1/2013 | Rao et al. |
| 2013/0027962 A1 * | 1/2013 | Takahashi ............ F21S 41/143 362/538 |
| 2013/0100264 A1 | 4/2013 | Kazakevich et al. |
| 2013/0140983 A1 | 6/2013 | Ling et al. |
| 2013/0188383 A1 | 7/2013 | Jaffe |
| 2013/0314893 A1 | 11/2013 | Paquette |
| 2013/0324791 A1 | 12/2013 | Cover et al. |
| 2013/0334546 A1 | 12/2013 | Wagenblast |
| 2014/0183584 A1 | 7/2014 | Tong et al. |
| 2014/0221740 A1 | 8/2014 | Kawula et al. |
| 2014/0275763 A1 | 9/2014 | King |
| 2014/0320677 A1 | 10/2014 | Jarvenpaa |
| 2015/0077972 A1 | 3/2015 | Sugiyama et al. |
| 2015/0115302 A1 * | 4/2015 | Eder ..................... C09K 11/02 257/98 |
| 2015/0130935 A1 | 5/2015 | Siann |
| 2015/0184830 A1 | 7/2015 | Nagao et al. |
| 2015/0362828 A1 | 12/2015 | Patel et al. |
| 2016/0091171 A1 * | 3/2016 | Okada ..................... F21V 13/14 372/44.01 |
| 2016/0262597 A1 | 9/2016 | Danchinyu et al. |
| 2017/0003000 A1 | 1/2017 | Narendran et al. |
| 2017/0045201 A1 | 2/2017 | Jones |
| 2018/0245775 A1 | 8/2018 | Malinskiy et al. |
| 2019/0032866 A1 * | 1/2019 | Annen ..................... F21K 9/65 |

FOREIGN PATENT DOCUMENTS

| | | |
|---|---|---|
| EP | 2822111 A1 | 1/2015 |
| GB | 1542873 A | 3/1979 |
| JP | 2006-518939 A | 8/2006 |
| JP | 2010160948 A | 7/2010 |
| JP | 2010-541295 A | 12/2010 |
| JP | 2015060871 A | 3/2015 |
| WO | 2004068903 A2 | 8/2004 |
| WO | 2008087243 A1 | 7/2008 |
| WO | WO-2009048704 A2 * | 4/2009 ......... H01L 33/0079 |
| WO | 2012016224 A2 | 2/2012 |

(56) References Cited

FOREIGN PATENT DOCUMENTS

| WO | 2012025179 A1 | 3/2012 |
| WO | 2013139619 A1 | 9/2013 |
| WO | 2013139620 A1 | 9/2013 |
| WO | 2013139675 A1 | 9/2013 |
| WO | 2017031138 A1 | 2/2014 |
| WO | 2014080562 A1 | 5/2014 |
| WO | 2015127630 A1 | 9/2015 |
| WO | 2017087448 | 5/2017 |
| WO | 2018152196 | 8/2018 |

OTHER PUBLICATIONS

Notice of Reasons for Rejection dated Feb. 5, 2019 for Japanese Patent Application No. 2018-509824, 10 pp.
First Notification of Office Action dated Dec. 26, 2018 for Chinese Patent Application No. 201680048579.6, 5 pp.
Search Report for Chinese Patent Application No. 201680048579.6, 2 pp.
Extended European Search Report dated Jan. 29, 2019 for European Patent Application No. 16837714.1, 8 pp.
International Search Report and Written Opinion issued in Application No. PCT/US2016/047235 dated Oct. 28, 2016, 11 pp.
3rd Chinese Office Action dated Apr. 1, 2020 for Chinese Patent Application No. 201680048579.6, 8 pages.
International Search Report and Written Opinion dated Jul. 21, 2020 for International Patent Application No. PCT/US2020/028505, 9 pages.
European Search Report dated Nov. 11, 2020 for European Patent Application No. 16837714.1, 5 pages.
Office action mailed Dec. 19, 2023 in connection with Japanese Patent Application No. 2023-010547 (22 pages).

\* cited by examiner

LIGHT SOURCE

CROSS REFERENCE TO RELATED APPLICATIONS

This application is a is a Continuation of U.S. patent application Ser. No. 16/672,001 filed Nov. 1, 2019, which is a Continuation of U.S. patent application Ser. No. 15/753, 369 filed Feb. 19, 2018, now U.S. Pat. No. 10,488,018, which is a 371 of International Application No. PCT/US2016/047235 filed on Aug. 17, 2016, which claims the benefit of U.S. Provisional Patent Application No. 62/255, 825 filed Nov. 16, 2015, and U.S. Provisional Patent Application No. 62/205,978 filed Aug. 17, 2015, each of which is incorporated by reference herein in its entirety.

BACKGROUND OF THE INVENTION

The present invention relates to solid state light emitting devices and, in particular, to those with a specified optical path and wavelength output.

Prior solid-state lighting devices typically use a light emitting diode (LED), an organic light emitting diode (OLED), or a laser diode (LD) as part of a remote phosphor system combined with one or more remote phosphors which convert a portion of the initial emitted radiation into a usable spectrum. A remote phosphor system is a combination of a reflective or transparent substrate, such as plastic, acrylic, glass, etc., that has a phosphorescent powder deposited on its surface. This substrate can then convert the initial emitted light, usually blue or blue-violet coherent light, into broad spectrum non-coherent light, which is most commonly white light.

These devices already outperform incandescent and fluorescent light sources with advantages that include longer lifetimes, energy savings, and brighter light output. However, while systems similar to those described above have been employed for some time, they still have issues that inhibit the technology. These issues include a low efficiency conversion of the laser light, the non-conversion of some or most of the laser light, the emission of dangerous coherent light, and the difficulty of controlling the direction and optical path of the emitted converted light.

For these reasons, the overall efficiency of the extant designs remains comparatively low, even when LD-based devices (the most efficient design) are analyzed. Furthermore, prior designs that use an LD to provide the primary light input completely saturate the remote phosphor elements. This over saturation can lead to the inadvertent emission of coherent laser light, which can cause damage to sensitive electronics, materials, eyes, and skin.

Thus, there is a need in the art for an improved solid state light source that has an extremely high operation and conversion efficiency, and is safe co use in multiple environments.

SUMMARY OF THE INVENTION

An integrated light source includes: an emissive radiation source having a first spectrum; an optical element located to direct emissions from the emissive radiation source; a volumetric spectrum converter located to convert emissions directed from the emissive radiation source to emissions having a second spectrum different from the first spectrum; an optical reflector located about the converter; an output filter, the reflector being located to reflect the converter emissions towards the output filter; and a package body having an internal cavity containing the emissive radiation source, optical element, converter, reflector, and filter, wherein desired light radiates from the cavity through the filter.

BRIEF DESCRIPTION OF THE DRAWINGS

Referring now to the drawings in which like reference numbers represent corresponding parts throughout.

DESCRIPTION OF THE PREFERRED EMBODIMENTS

To overcome the limitations described above, and to overcome other limitations that will become apparent upon reading and understanding the present specification, a light source is disclosed that employs a solid state light emitting device pumping a medium wherein phosphor is volumetrically disposed. The light emitting device produces a beam of light that is directed onto the phosphor and subsequently converted into either a broad- or narrow-spectrum light of desired wavelengths. By utilizing a volumetrically disposed phosphor, a higher percentage of the incoming light can be converted, thus increasing the efficiency and safety of the system. This converted light can then be sent over a desired optical path so as to control the final light output precisely.

Overview

To address these issues, a method for volumetrically disposing phosphorescent materials into a substrate has been invented. The benefits of a volumetrically disposed substrate over the current system of using a thin coating are numerous and described herein. One of the benefits is the increased conversion of laser light into non-coherent light, which stems from the amount of phosphor available for light conversion. The current thin surface coatings of phosphor get saturated with pre-converted light quickly and can only convert a small amount of light at a time, greatly decreasing system efficiency. Attempting to increase the amount of light-converting phosphor using the current technology becomes extremely difficult as coherent light only travels in one direction, and thus requiring the layer of phosphor to either increase in thickness, which impedes transmission and therefore effectiveness, or be distributed across a prohibitively large area. Using a volumetric deposition method allows for a larger amount of phosphor to be utilized in converting coherent light, without creating the need for a larger emission beam of the coherent light. An increase in the amount of phosphor being utilized for conversion means that more non-coherent light is produced with the same input; therefore the system is more efficient. In addition, as more coherent light is converted to non-coherent light, there is a decline in possibility that there will be dangerous coherent laser light emanating from the final light source system.

An advantageous embodiment of the invention can include one or more optical elements placed in specific arrangements to increase the overall efficiency of the system and decrease the potential of harmful coherent light emissions. These elements include, but are not limited to, filters, lenses, a geometric optical reflector, and a housing. The inclusion of one or more of the aforementioned optical elements allows for the modification and specialization of the solid state lighting system for specific instances and use cases.

DETAILED DESCRIPTION

Figure 1:
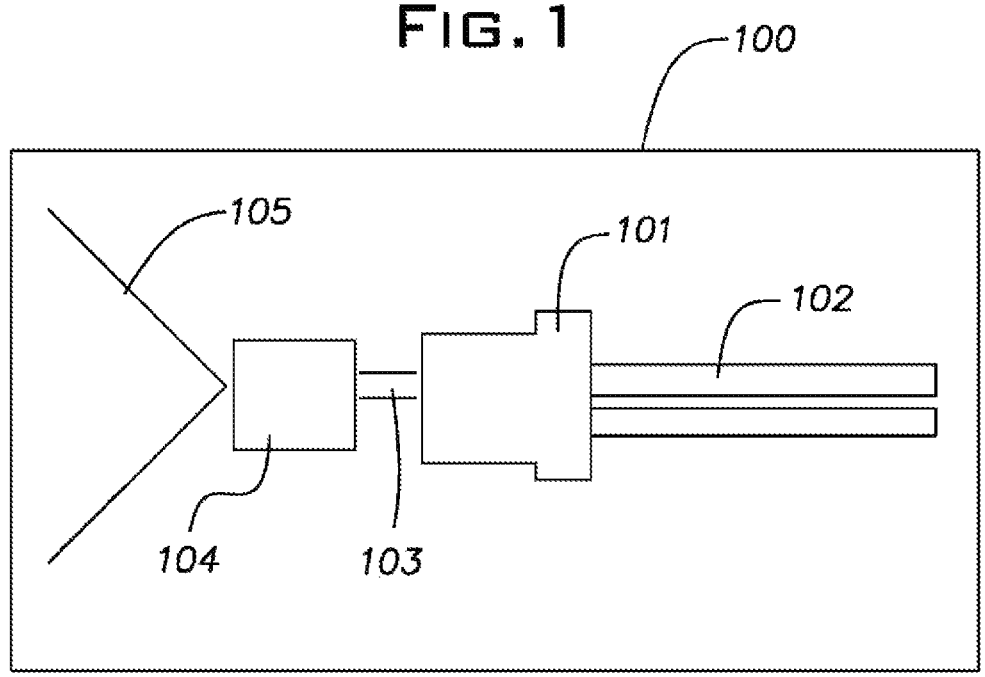
FIG. 1 is a schematic diagram of a basic solid state light source system according to the present invention.

Referring to FIG. 1, a solid state light source 100 is illustrated. The light source 130 includes a laser diode 101 in the form of a semiconductor laser disposed inside of a standard electronics component package. The laser diode 101 has power pins 102 exiting the package. The laser diode 101 may, for example, provide coherent light within the range of 400-480 nm and, preferably, 430-470 nm. Beam 103 is the coherent beam of laser light that the laser diode 101 produces. Beam 103 strikes, and interacts with, volumetric spectrum converter 104 (e.g., PMMA, which is volumetrically disposed with particles of phosphor). Converter 104 thusly converts the incoming coherent laser beam 103 into outgoing broad spectrum light 105. The light 105 may be of any specified color, such as, but not limited to, white, and is decided by the chemical composition of the phosphor disposed in the medium 104.

Figure 2:
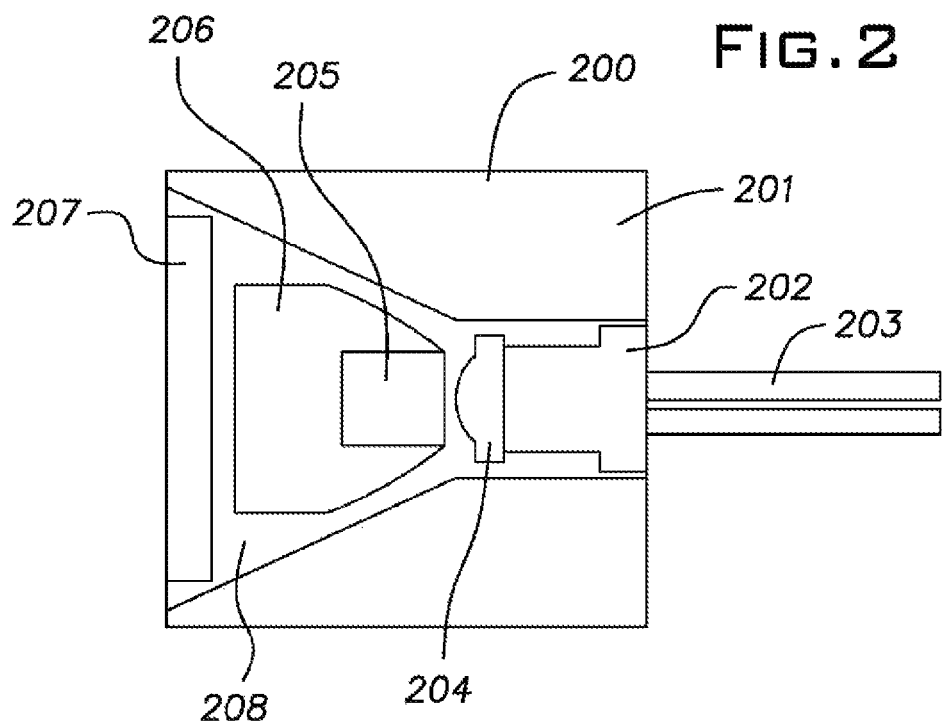
FIG. 2 is a schematic diagram of another integrated light source that utilizes multiple parts to enhance the efficiency and safety of the light source, according to one embodiment of the present invention.

Referring to FIG. 2, a possible design of an integrated light source 200 is illustrated. The light source 200 includes an emissive radiation source 202 having a first output spectrum, for example, in the form of a semiconductor laser diode disposed inside of a standard electronics component package. The laser diode has power pins 203 exiting the package. Situated in front of the emission side of the emissive radiation source 202 is an optical element 204 composed, for example, of a lens, or system of lenses, that directs the coherent laser light emitted from the laser diode 202 onto a specific area. The optical element 204 may, for example, collimate, convergently focus, or divergently focus the emissions of the emissive radiation source 202 for conversion by the volumetric spectrum converter 205. The volumetric spectrum converter 205 converts the emissions from the emissive radiation source 202 to emissions having a second spectrum different than the first spectrum. The volumetric spectrum converter 205 is disposed inside of a geometric optical reflector 206 which is in this embodiment, but is not limited to, a parabolic solid that directs the light converted by the converter 205 towards a specified direction, which, in this case, is forward towards an output filter 207. After the light has been directed forward by the optical reflector 206, the light interacts with the filter 207 which removes any coherent light that has not been converted into non-coherent light by the converting medium 205. Following this, only the filtered, non-coherent light can exit the light source 200 making the emitted light safe to use in multiple environments. Referring to the light source 200, all aforementioned components are situated in an internal cavity 208 which is excised from a package body 201, which may be, for example, a piece of solid material such as, but not limited to, aluminum, steel, or copper.

Figure 3:
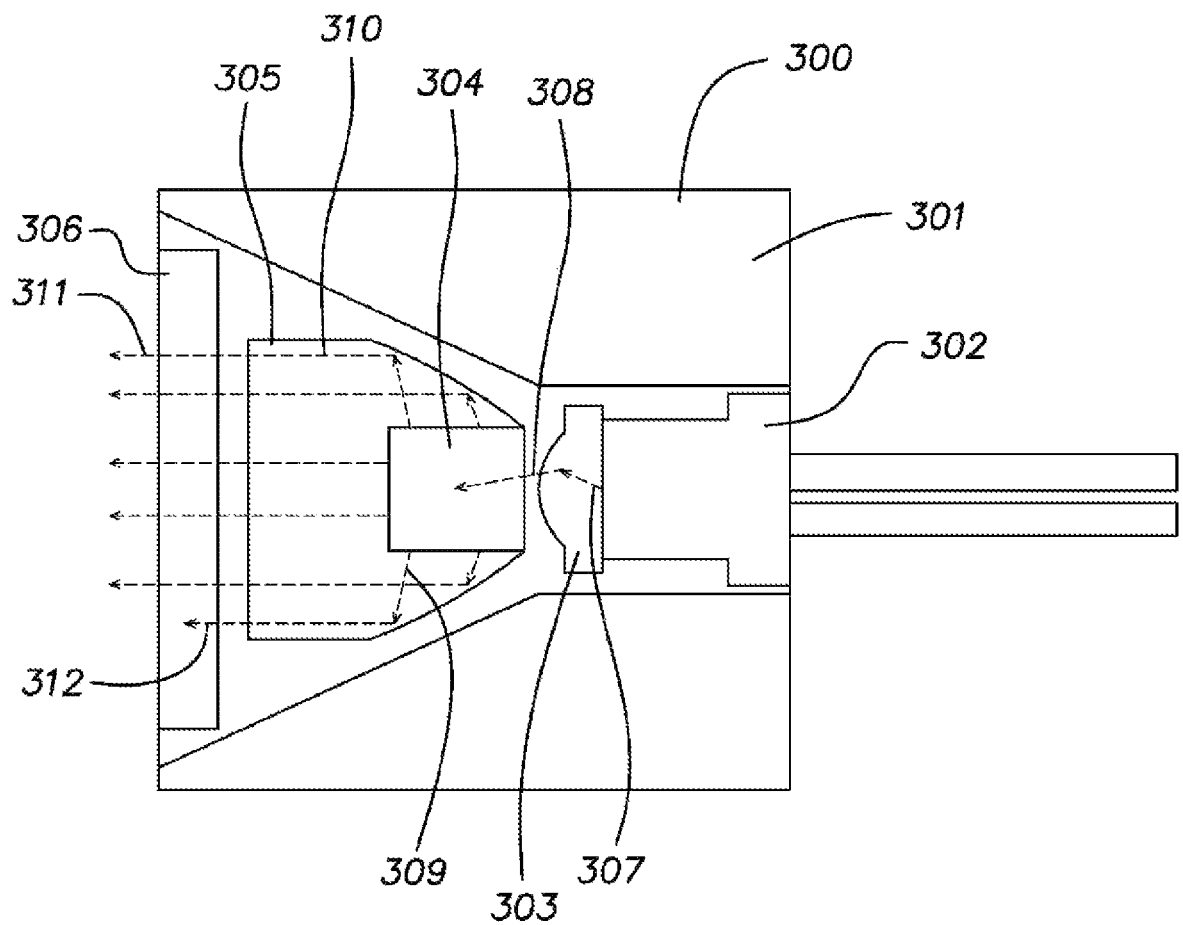
FIG. 3 is a schematic diagram that utilizes the integrated light source of FIG. 2 and illustrates a possible beam path for the light in the system, according to an embodiment of the present invention.

Referring to FIG. 3, a possible light path utilizing the light source seen in FIG. 2 is illustrated. The light source 300, which is comparable to the light source 200 of FIG. 2, includes a package body 301, which is comparable to package body 201 of FIG. 2. Within the light source 300 is positioned a laser diode 302 in the form of a semiconductor laser disposed inside of a standard electronics component package. The laser diode 302 emits a beam of coherent light 307 which proceeds to interact with optical element 303. The optical element 303 redirects the coherent beam 307 into a more precise path 308, which allows it to interact more efficiently with the volumetric spectrum converter 304. The converter 304 converts the coherent light 308 into non-coherent light 309 through internal physical interaction between the coherent light 308 with the volumetrically disposed phosphor present in the converter 304. Subsequently the non-coherent light 309 is emitted in multiple directions from the converter 304. The non-coherent light 309 then interacts with the geometric optical reflector 305. This optical reflector 305 reflects the non-coherent multi-directional light 309 and redirects it forward 310. Most of the redirected light 310 passes through the filter 306 and leaves 311 the light source 300. Some of the redirected light 310 interacts with the filter 306 and is prevented 312 from exiting the device for reasons such as design and safety specifications.

Figure 4:
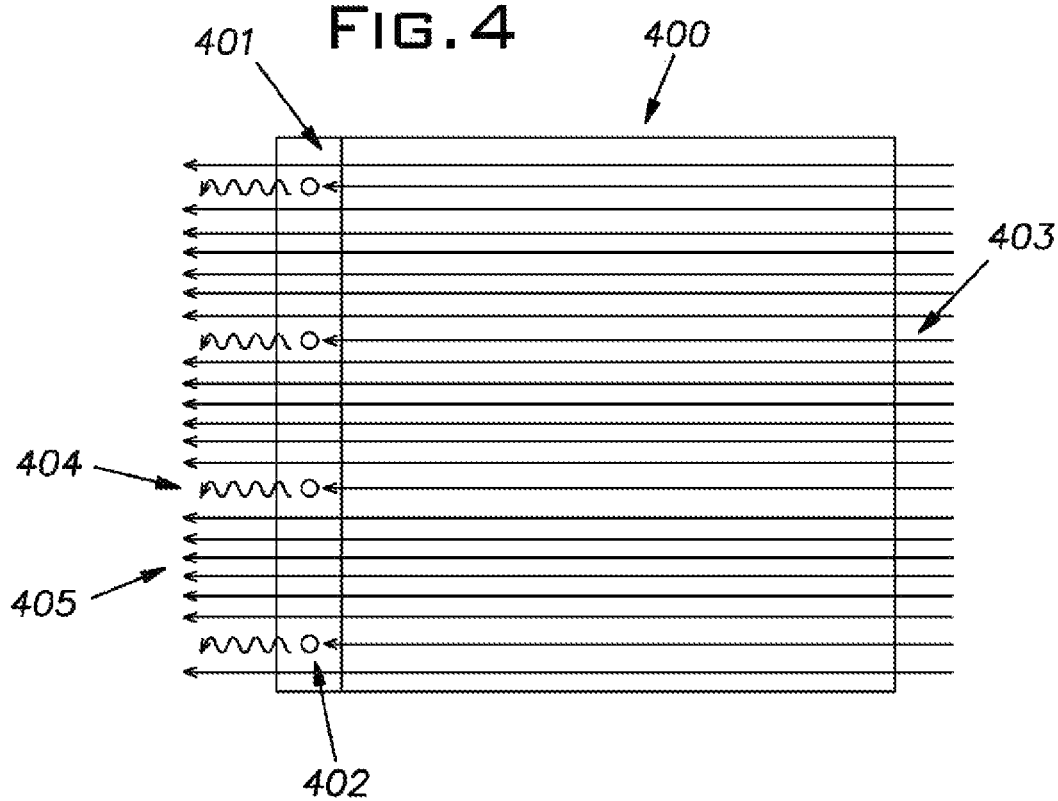
FIG. 4 is a schematic diagram of the operation of a prior art phosphor coated converter.

FIG. 4 illustrates a phosphor coated converter. The portion 401 is a thinly deposited phosphor coating on a substrate 400. The thin phosphor coating 401 has particles of phosphor 402 that are disposed within the coating. The particles 402 convert light coming in from the right side 403 into a different wavelength of light 404. Because the coating layer 401 is thin, there is a limited amount of phosphor particles 402 that can convert the incoming light 403. Therefore, a large portion of the incoming light 403 is not converted, and leaves the substrate unaffected 405.

Figure 5:
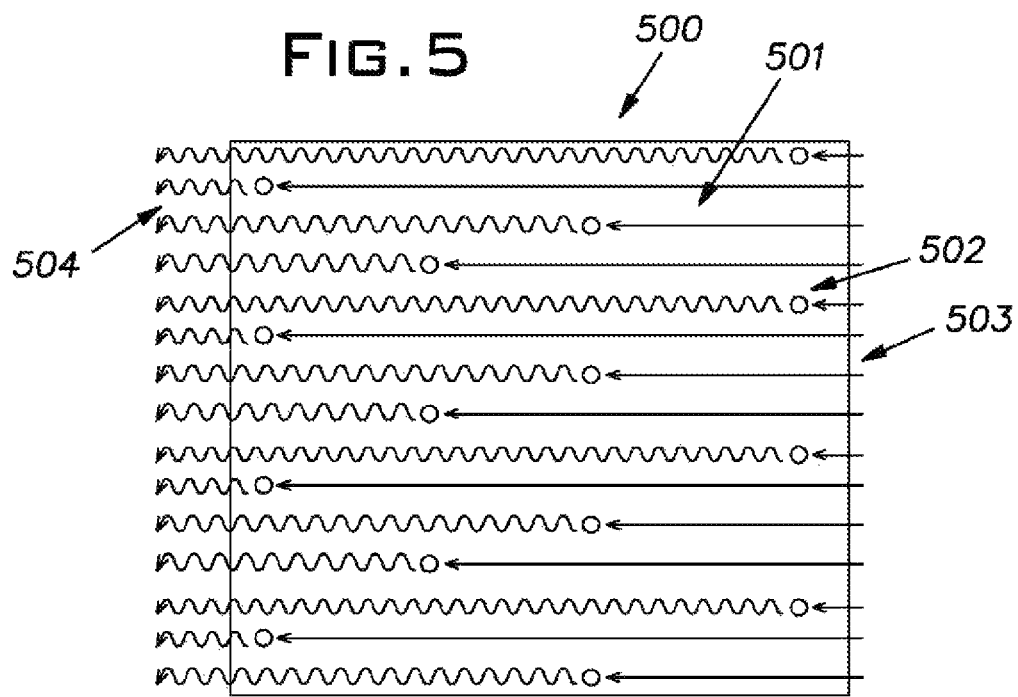
FIG. 5 is a schematic diagram of the operation of an example volumetric spectrum converter according to an aspect of the invention.

FIG. 5 illustrates a volumetric spectrum converter, as opposed to the coating in FIG. 4. In this case, the phosphor 501 is volumetrically disposed within the substrate 500. This leads to more particles of phosphor 502 that can interact with the incoming light 503, and therefore participate in light conversion. Here there is a much larger amount of incoming light 503 that gets converted into the desired wavelength 504. The use of a volumetric spectrum converter outperforms prior art phosphor coated converters.

It should be noted that this is a simplification for clarity. The emitted light does not necessarily come out of the front all together. It is generally scattered omnidirectionally, and the reflective paraboloid (e.g., 206, 305) of the light source is what makes the light go in the same direction.

The optical reflector may be, for example, a molded, machined, 3-D printed or otherwise fabricated piece of optical material such as PMMA, polystyrene, polycarbonate, polyester, copolymers or blends of a combination of the aforementioned materials. It is designed to redirect omnidirectional light into a desired optical path. It may be, for example, a solid geometric form, a hollow geometric form, or other combinations of geometric surfaces. It may also advantageously include a layer of reflective material that enhances its capacity to redirect light. This layer may be, for example, an external surface, an internal surface, or a combination of surfaces.

The converter (e.g., 205, 304) may be chosen to convert emissions from the emissive radiation source (e.g., blue or violet light) to radiation of another wavelength, for example, narrow or broad spectrum, non-coherent radiation, it may be made using converting material that may include, for example, phosphorescent material, florescent material, other radiation converting material, or combinations of these materials. The converting material is volumetrically disposed in a substrate that may include, for example, PMMA, polystyrene, polycarbonate, polyester, copolymers or blends of a combination of the aforementioned materials to create an effectively homogenous composite. This process may include, for example, extrusion, coating, lamination, blending, mixing, or suspending.

A particular example of making a converter is extruding a substrate with the converting material as a blended and/or multilayered solid composite. In particular, the solid composite can be made with between 2 and 500,000 layers which can be tuned for specified end use performance metrics. It is desirable for the converter to not have any defects, such as, for example, voids, entrapped gas, air bubbles, adulterating particulate of any material other the those purposely desired, or entrapped liquid of any sort, either vapor or liquid state, larger than 1 micron.

The converter can possess a ratio of converting material, or a combination of multiple materials to the substrate, that can be tuned for specified end use performance metrics.

In a preferred embodiment, the converting material may be of a single phosphor with a particular particulate size, or a mix of phosphor powders with either similar or dissimilar particulate sizes providing an emission of radiation that is either of a stable and/or variable wavelength. The emitted radiation can be for example, white light.

In another preferred embodiment, the converter possesses a ratio of converting material to the substrate between 5% and 15%.

It is also possible to tune the converter for specified end use performance metrics by varying the thickness and diameter of the converter. For example, a preferred embodiment includes a converter with a thickness of between 0.5 mm and 5 mm and a radius of between 0.5 mm and 5 mm.

The output filter (e.g., 207, 506) may be, for example, an optically clear window, but in the preferred embodiment, it eliminates any emitted radiation from the emissive radiation source that has not been converted by the converter. It also may be, for example, a long-pass, short-pass, band-pass or band-stop filter to further pass or cutoff wavelengths of radiation, to further condition the emitted light.

It should be further noted that the emissive geometry of the emitted radiation spectrum from the device may be further conditioned, directed, focused, collimated, reflected, refracted, diffracted, or otherwise modified with the inclusion of suitable optical components.

The following are exemplary embodiments of the integrated light source.

Embodiment 1. An integrated light source comprising:
an emissive radiation source having a first spectrum;
an optical element located to direct emissions from said emissive radiation source;
a volumetric spectrum converter, said converter being located to convert emissions directed from said emissive radiation source to emissions having a second spectrum different from said first spectrum;
an optical reflector located about said converter;
an output filter, said reflector being located to reflect said converter emissions towards said output filter; and
a package body having an internal cavity, said cavity containing said emissive radiation source, optical element, converter, reflector, and filter, wherein desired light radiates from said cavity through said filter.

Embodiment 2. A light source according to embodiment 1, wherein said radiation source operates in the range of 400 nm to 480 nm.

Embodiment 3. A light source according to embodiment 1 or 2, wherein said radiation source operates in the range of 430 nm to 470 nm.

Embodiment 4. A light source according to any of embodiments 1-3, wherein the optical element may either collimate, convergently focus, or divergently focus the emissive radiation source emissions onto the converter.

Embodiment 5. A light source according to any of embodiments 1-4, wherein the optical reflector redirects omnidirectional light into a desired optical path.

Embodiment 6. A light source according to any of embodiments 1-5, wherein the optical reflector includes a layer of reflective material that enhances its capacity to redirect light.

Embodiment 7. A light source according to any of embodiments 1-6, wherein the converter converts the emissions from the emissive radiation source to emissions of different wavelength, a narrower spectrum, or a broader spectrum, of non-coherent radiation.

Embodiment 8. A light source according to any of embodiments 1-7, wherein the converter is composed of a converting material volumetrically disposed in a substrate of non-converting material to form a homogeneous composite.

Embodiment 9. A light source according to any of embodiments 1-8, wherein the converter is created using a process that includes at least one of extrusion, coating, lamination, blending, mixing, or suspending.

Embodiment 10. A light source according to any of embodiments 1-9, wherein the process of creating the converter is the extrusion of the substrate with the converting material as a blended or multilayered solid composite.

Embodiment 11. A light source according to embodiment 9, wherein the solid composite has a number of layers between 2 and 500,000.

Embodiment 12. A light source according to any of embodiments 1-11, wherein the converter does not have any defects including voids, entrapped gas, air bubbles, adulterating particulate of any material other than those purposely desired, or entrapped liquid of any sort, either vapor or liquid state, larger than 1 micron.

Embodiment 13. A light source according to any of embodiments 1-12, wherein the converter includes one or more phosphors, each with a particular particulate size providing an emission of radiation that is of a stable or variable wavelength.

Embodiment 14. A light source according to any of embodiments 1-13, wherein the converter possesses a ratio of one or more converting materials to the substrate that can be tuned for specified end use performance metrics.

Embodiment 15. A light source according to any of embodiments 1-14, wherein the converter possesses a ratio of converting material to the substrate between 5% and 15% by volume.

Embodiment 16. A light source according to any of embodiments 1-15, v/herein the converter possesses dimensions that can vary in thicknesses and diameters which can be tuned for specified end use performance metrics.

Embodiment 17. A light source according to any of embodiments 1-16, wherein the converter possesses a thickness between 0.5 mm and 5 mm and a radius between 0.5 mm and 5 mm.

Embodiment 18. A light source according to any of embodiments 1-17, wherein the filter eliminates any emission from the emissive radiation source that has not been converted by the converter as well as optionally further conditioning the emitted light.

Embodiment 19. A light source according to any of embodiments 1-18, wherein the emissive geometry of the emitted radiation spectrum from the device may be further conditioned, directed, focused, collimated, reflected, refracted, diffracted, or otherwise modified with the inclusion of suitable optical components.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A light converting device comprising:
    a light source emitting input light;
    an optical element located to receive the input light emitted from the light source and output collimated input light;
    a homogeneous composite substrate optically coupled to the optical element and including a plurality of particles volumetrically disposed throughout the homogeneous composite substrate, each of the plurality of particles being configured to convert the conditioned input light from the light source to output light, the conditioned input light having a first wavelength and the output light having a second wavelength different than the first wavelength, wherein the optical element is disposed between the light source and homogeneous composite substrate;
    a package body having an internal cavity extending through the package body from a distal end of the package body to a proximal end of the package body, wherein the light source, the optical element, and the homogeneous composite substrate are disposed within the internal cavity; and
    an optically clear window covering the distal end of the package body, the window configured to allow the output light to be emitted from the light converting device at the distal end of the package body,
    wherein the window is substantially perpendicular to the output light and the package body includes a central axis extending from the proximal end to the distal end, and the light source, the optical element, the homogeneous composite substrate, and the window are optically coupled in series along the central axis.

2. The light converting device of claim 1 further comprising:
    an optical reflector configured to house the homogeneous composite substrate, wherein the optical reflector reflects one or more of the input light, the conditioned input light, and the output light, wherein the optical reflector is disposed within the internal cavity.

3. The light converting device of claim 2, wherein the optical reflector includes a layer of reflective material configured to reflect and redirect one or more of the input light, the conditioned input light, and the output light.

4. The light converting device of claim 2, wherein the optical reflector redirects omnidirectional light into a desired optical path.

5. The light converting device of claim 1, wherein the homogeneous composite substrate is formed from a plurality of layers.

6. The light converting device of claim 5, wherein the plurality of particles is a plurality of suspended particles volumetrically disposed within each of the plurality of layers of the homogeneous composite substrate.

7. The light converting device of claim 1 further comprising:
    an output filter optically coupled to the homogeneous composite substrate and located to receive the output light,
    wherein the output filter is configured to eliminate the input light and the conditioned input light from the light source that has not been converted by the homogeneous composite substrate as well as optionally further conditioning the output light.

8. The light converting device of claim 1, wherein the light source, the optical element, the homogeneous composite substrate, and the window form an optical pathway.

9. The light converting device of claim 1, wherein the optical element is configured to collimate, convergently focus, or divergently focus the input light onto the homogeneous composite substrate.

10. The light converting device of claim 1, wherein the input light has a range of 400 nm to 480 nm.

11. The light converting device of claim 1, wherein the input light has a range of 430 nm to 470 nm.

12. The light converting device of claim 1, wherein the homogeneous substrate is created using a process that includes at least one of extrusion, coating, lamination, blending, mixing, or suspending.

13. The light converting device of claim 1, wherein a ratio of the plurality of particles to the homogeneous composite substrate is between 5% and 15% by volume.

14. The light converting device of claim 1, wherein the output light is a different wavelength, a narrower spectrum, a broader spectrum, or non-coherent radiation compared to the input light or the conditioned input light.

15. The light converting device of claim 1, wherein the plurality of particles is composed of a converting material configured to convert the conditioned input light to the output light, and the homogeneous composite substrate is composed of a non-converting material.

16. The light converting device of claim 1, wherein the homogeneous composite substrate does not have any defects including voids, entrapped gas, air bubbles, adulterating particulate of any material other than those purposely desired, or entrapped liquid of any sort, either vapor or liquid state, larger than 1 micron.

17. The light converting device of claim 1, wherein the plurality of particles is comprised of one or more phosphors, each with a particular particulate size configured to emit the output light that is of a stable or variable wavelength.

18. The light converting device of claim 1, wherein an emissive geometry of the output light is configured to be conditioned, directed, focused, collimated, reflected, refracted, diffracted, or otherwise modified with an inclusion of suitable optical components.

19. The light converting device of claim 1, wherein the homogeneous composite substrate is comprised of one or more of poly (methyl methacrylate), polystyrene, polycarbonate, polyesters, copolymers, or combinations thereof.

20. The light converting device of claim 1 further comprising:
    an output filter optically coupled to the homogeneous composite substrate and configured to receive the output light, wherein the homogeneous composite substrate is disposed between the output filter and the optical element, wherein the plurality of particles are a plurality of suspended particles volumetrically disposed within the homogeneous composite substrate, and wherein the output filter is disposed within the internal cavity of the package body, the internal cavity configured to emit the output light through the output filter and the window.

21. The light converting device of claim 1, wherein the window is flat.

22. The light converting device of claim 1, wherein the window extends into the distal end of the package body.

23. The light converting device of claim 1, wherein a plane extending through the window is substantially perpendicular to the central axis.

* * * * *